(12) United States Patent
Kami et al.

(10) Patent No.: US 10,905,011 B2
(45) Date of Patent: Jan. 26, 2021

(54) STATE DETECTING DEVICE

(71) Applicant: TDK Corporation, Tokyo (JP)

(72) Inventors: Masafumi Kami, Tokyo (JP); Hiroshi Kobayashi, Tokyo (JP); Tamon Kasajima, Tokyo (JP)

(73) Assignee: TDK Corporation, Tokyo (JP)

( * ) Notice: Subject to any disclaimer, the term of this patent is extended or adjusted under 35 U.S.C. 154(b) by 1 day.

(21) Appl. No.: 16/494,809

(22) PCT Filed: Mar. 16, 2018

(86) PCT No.: PCT/JP2018/010536
§ 371 (c)(1),
(2) Date: Sep. 17, 2019

(87) PCT Pub. No.: WO2018/173956
PCT Pub. Date: Sep. 27, 2018

(65) Prior Publication Data
US 2020/0100363 A1 Mar. 26, 2020

(30) Foreign Application Priority Data

Mar. 22, 2017 (JP) ................................ 2017-055958

(51) Int. Cl.
*H05K 7/00* (2006.01)
*H05K 1/18* (2006.01)
(Continued)

(52) U.S. Cl.
CPC ............ *H05K 1/181* (2013.01); *H01M 2/025* (2013.01); *H05K 1/118* (2013.01);
(Continued)

(58) Field of Classification Search
CPC .. H05K 1/181; H05K 1/118; H05K 2203/043; H05K 2201/10151;
(Continued)

(56) References Cited

U.S. PATENT DOCUMENTS

2013/0266858 A1* 10/2013 Inoue ..................... H01G 11/84
429/211
2013/0295434 A1* 11/2013 Ayub .................. H01M 2/1061
429/157
(Continued)

FOREIGN PATENT DOCUMENTS

| JP | 2010-32492 A | 2/2010 |
|---|---|---|
| JP | 2012-51429 A | 3/2012 |

(Continued)

OTHER PUBLICATIONS

International Search Report of International Application No. PCT/JP2018/010536, dated May 15, 2018.

*Primary Examiner* — Yuriy Semenenko
(74) *Attorney, Agent, or Firm* — Leydig, Voit & Mayer Ltd.; John Augustyn

(57) ABSTRACT

A state detecting device which can be applied even in a severe environment. The state detecting device includes a chargeable all-solid-state battery, a piezoelectric element which supplies charging power to the all-solid-state battery, and an integrated circuit including various sensors which operate with electric power supplied from the all-solid-state battery. The all-solid-state battery, the piezoelectric element, and the integrated circuit are mounted on one surface of a flexible substrate. The flexible substrate is attached to a flexible object which is either an object to be measured or constitutes at least part of an inner surface of a space to be measured.

8 Claims, 3 Drawing Sheets

(51) Int. Cl.
*H01M 2/02* (2006.01)
*H05K 1/11* (2006.01)

(52) U.S. Cl.
CPC ............ *H05K 2201/10037* (2013.01); *H05K 2201/10151* (2013.01); *H05K 2203/043* (2013.01)

(58) Field of Classification Search
CPC ......... H05K 2201/10037; H01M 2/025; Y02E 60/10; G01M 5/0041; G01K 1/024; G01K 1/143; G01K 1/16; G01D 21/00; G01D 11/24; G01D 11/30; G01L 19/0092
See application file for complete search history.

(56) References Cited

U.S. PATENT DOCUMENTS

| | | | |
|---|---|---|---|
| 2014/0118134 A1* | 5/2014 | Won | B60C 23/0498 340/442 |
| 2014/0127566 A1* | 5/2014 | Kuriki | H01G 11/28 429/211 |
| 2016/0043070 A1* | 2/2016 | Momo | H01L 27/1207 257/296 |
| 2016/0172704 A1 | 6/2016 | Wantanabe et al. | |
| 2018/0064881 A1* | 3/2018 | Whalley | A61M 5/31568 |
| 2018/0108944 A1* | 4/2018 | Yamakaji | C07D 303/40 |
| 2018/0355234 A1* | 12/2018 | Grossman | C09K 5/14 |
| 2019/0162771 A1* | 5/2019 | Miyazawa | G01R 31/3842 |
| 2020/0203532 A1* | 6/2020 | Yamazaki | H01L 29/66969 |
| 2020/0355749 A1* | 11/2020 | Takahashi | G01R 31/367 |

FOREIGN PATENT DOCUMENTS

| | | |
|---|---|---|
| JP | 2014-60014 A | 4/2014 |
| JP | 2015-076158 A | 4/2015 |
| JP | 2015-220103 A | 12/2015 |
| JP | 2015-220106 A | 12/2015 |
| JP | 2016-025777 A | 2/2016 |

* cited by examiner

1 State Detecting Device

STATE DETECTING DEVICE

TECHNICAL FIELD

The present invention relates to a state detecting device which detects states such as temperature and pressure.

BACKGROUND ART

In a device for detecting temperature and pressure, there is known that power is supplied to a temperature sensor and a pressure sensor by a secondary battery or a power generator.

PRIOR ART DOCUMENT

Patent Document

[Patent Document 1] Japanese Patent No. 5264842

SUMMARY OF THE INVENTION

Problem to be Solved by the Invention

An environment in which a sensor is installed may become high temperature or may deform. When a secondary battery for supplying electric power to a sensor is a button type battery, the button type battery is difficult to withstand a high-temperature environment and to be reduced in size, whereby it is difficult to use it in an environment in which deformation force is applied.

The present invention was made in view of this situation and it is an object of the present invention to provide a state detecting device which can be applied suitably even in a severe environment.

Means for Solving the Problem

An aspect of the present invention is a state detecting device. The state detecting device comprises:
 a chargeable all-solid-state battery;
 a power generator which supplies charging power to the all-solid-state battery;
 a sensor which operates with electric power supplied from the all-solid-state battery; and
 a flexible substrate on which the all-solid-state battery, the power generator and the sensor are mounted.

The flexible substrate may be attached to a flexible object which is to be measured or constitutes at least part of an inner surface of a space to be measured.

The flexible substrate may be attached to the object which is moveable.

A thermal conduction pattern may be formed on at least part of a surface on an object-to-be-measured side of the flexible substrate.

The thermal conduction pattern may extend on a surface opposite to the object side of the flexible substrate and reach the vicinity of the sensor mounted on the surface opposite to the object side.

A thermal conduction pattern which is in contact with a thermal conductor incorporated into an object to be measured may be formed on the flexible substrate and be located or extend in the vicinity of the sensor on the sensor mounted surface of the flexible substrate.

The all-solid-state battery, the power generator and the sensor may be mounted to the flexible substrate by reflow soldering.

The sensor may include at least one selected from a temperature sensor, an acceleration sensor, a pressure sensor and a distortion sensor.

It is to be noted that any arbitrary combination of the above-described structural components as well as the expressions according to the present invention changed among a system and so forth are all effective as and encompassed by the present aspects.

Effect of the Invention

According to the present invention, there can be provided a state detecting device which can be applied suitably even in a severe environment.

EMBODIMENTS FOR CARRYING OUT THE INVENTION

Figure 1:
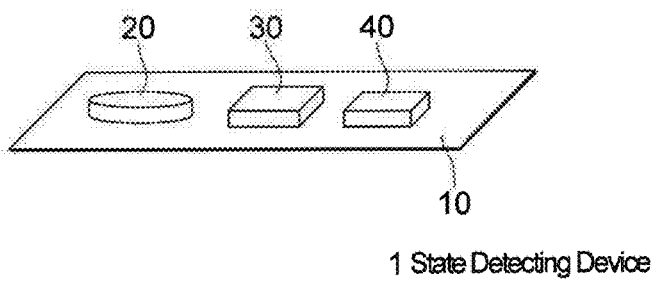
FIG. 1 is a schematic perspective view of a state detecting device 1 according to a first embodiment.
Figure 2:
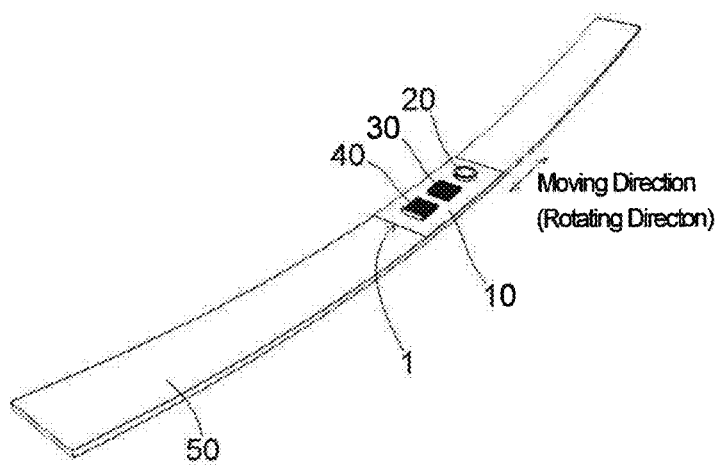
FIG. 2 is a schematic perspective view of the state detecting device 1 and an object 50 to which the state detecting device 1 has been attached.
Figure 3:
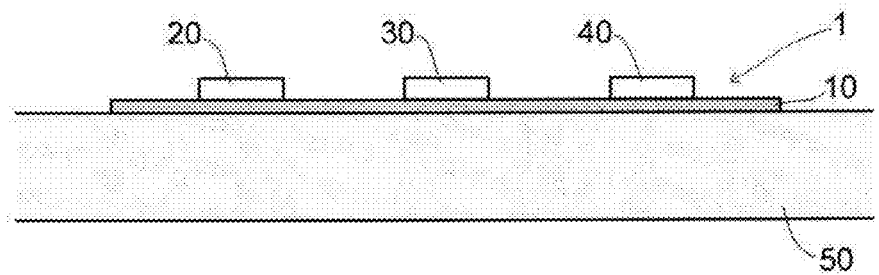
FIG. 3 is an enlarged sectional view of the state detecting device 1 and the object 50.

Preferred embodiments of the present invention will now be described in detail with reference to the drawings. The same or equivalent constituent parts, members, etc., shown in the drawings are designated by the same reference numerals and will not be repeatedly described as appropriate. The embodiments are not intended to limit the invention but are mere exemplifications, and all features or combinations thereof described in the embodiments do not necessarily represent the intrinsic natures of the invention.

First Embodiment

With reference to FIGS. 1 to 5, a state detecting device 1 according to a first embodiment will be described hereinunder. The state detecting device 1 comprises a flexible substrate 10, a piezoelectric element 20 as a power generator, an all-solid-state battery 30 which is a secondary battery and an integrated circuit (IC) 40 including various sensors.

The flexible substrate 10 is a flexible printed circuit (FPC) board, and an unshown wiring pattern for electrically interconnecting the piezoelectric element 20, the all-solid-state battery 30 and the integrated circuit 40 is formed on the flexible substrate 10. The piezoelectric element 20, the all-solid-state battery 30 and the integrated circuit 40 are mounted together to the top surface (one surface) of the flexible substrate 10 preferably by reflow soldering. The under surface (the other surface) of the flexible substrate 10 is a surface in contact with an object 50 to which the state detecting device 1 is to be attached. The under surface of the flexible substrate 10 may be adhesive. The piezoelectric element 20, the all-solid-state battery 30 and the integrated circuit 40 may be arranged in one row on the top surface of the flexible substrate 10 in the mentioned order. Preferably, the piezoelectric element 20, the all-solid-state battery 30 and the integrated circuit 40 have a height of not more than 1 mm from the top surface of the flexible substrate 10.

The piezoelectric element 20 is, for example, a piezoelectric ceramic and generates power by the vibration of the object 50 to which the state detecting device 1 has been attached. The power generator may be a power generator which generates power by vibration like the piezoelectric element 20 or a temperature difference power generation element which is shaped like a thin chip and generates power by utilizing a temperature difference (http://www.micropelt.com/thermogenerator.php). Power obtained by the generation of the piezoelectric element 20 is supplied as charging power to the all-solid-state battery or as operation power to the integrated circuit 40. The all-solid-state battery 30 is a battery which contains a solid electrolyte and not an organic electrolytic solution and therefore has features that there is no risk caused by volatilization or leakage of the electrolytic solution, a temperature range that it can operate is wide and it can be reduced in size as compared with a button type battery. The all-solid-state battery 30 may be a film type (thin film type) battery though it is a chip type battery in the illustrated example.

Figure 4:
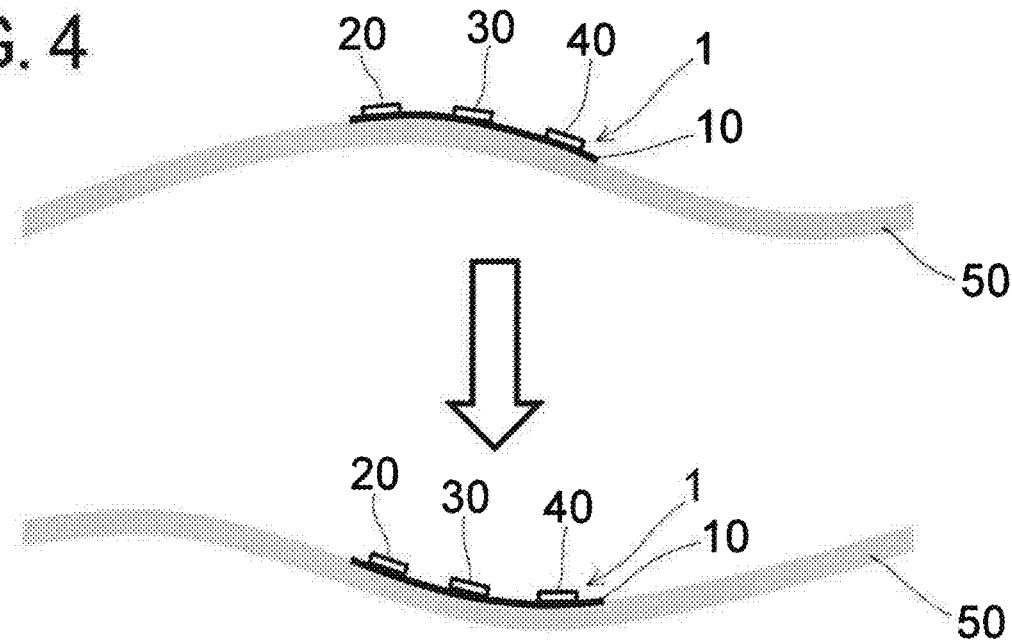
FIG. 4 is a schematic diagram showing that the object 50 to which the state detecting device 1 has been attached is deformed.
Figure 5:
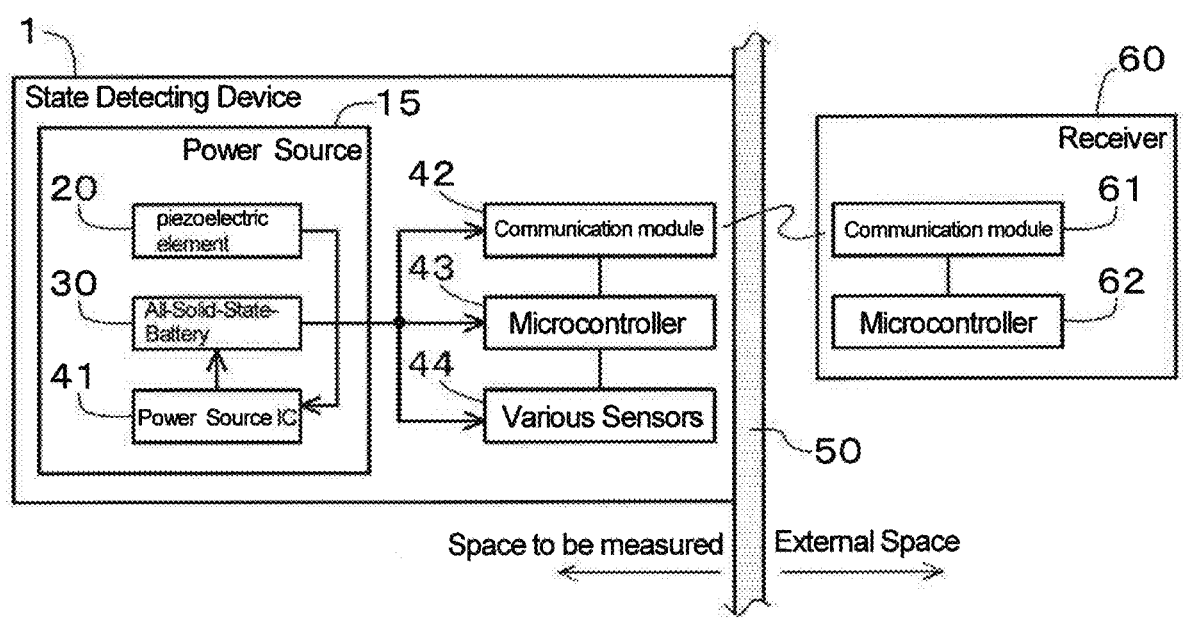
FIG. 5 is a block diagram of the state detecting device 1 and a receiver 60 both of which communicate with each other.

As shown in FIG. 5, the integrated circuit 40 includes a power source IC 41, a communication module (communication means) 42, a microcontroller 43 as a control section and various sensors 44. Although the integrated circuit 40 is shown as a single chip part (IC chip) in FIGS. 1 to 4, it may be a combination of a plurality of chip parts. For example, the power source IC 41 may be a chip part separate from the communication module 42, the microcontroller 43 and the various sensors 44, blocks in FIG. 5 constituting the integrated circuit 40 may be separate chip parts, and the various sensors 44 may be separate chip parts for each sensor type.

The power source IC 41 constitutes the power source 15 of the state detecting device 1 together with the piezoelectric element 20 and the all-solid-state battery 30. The power source IC 41 converts power supplied from the piezoelectric element 20 into charging power for the all-solid-state battery 30 and supplies it to the all-solid-state battery 30. The all-solid-state battery 30 supplies operation power to the communication module 42, the microcontroller 43 and the various sensors 44. The communication module 42 communicates with the communication module 61 of a receiver 60 existent in an external space and transmits detection results from the various sensors 44 to the communication module 61. The microcontroller 43 controls the communication module 42 and receives detection signals from the various sensors 44 to carry out required operations (such as signal processing). The various sensors 44 include at least one selected from a temperature sensor, an acceleration sensor, a pressure sensor and a distortion sensor. The receiver 60 is existent outside a space to be measured and includes the communication module 61 and a microcontroller 62 as a control section.

The object 50 has flexibility (softness) like rubber. The object 50 may be a moveable object. The moveable object is a concept including rotors. When the object 50 is a moveable object, the moving direction of the object 50 is shown by an arrow in FIG. 2. The object 50 may be an object to be measured (measurement target) for temperature or distortion itself, may constitute at least part of an inner surface of a space to be measured (measurement target space) for, for example, temperature and pressure, or may be an object to be measured and constitute at least part of an inner surface of a space to be measured. The space in which the state detecting device 1 is to be installed may be a space which is partitioned (separated) from an external space by the object 50 or the object 50 and unshown another object, thereby making it impossible or difficult to carry out wired communication with the external space or power transmission to and reception from the external space.

According to this embodiment, the following effects can be obtained.

(1) Since the all-solid-state battery 30 can be reduced to the same size as the piezoelectric element 20 and the integrated circuit 40 unlike a button type battery, it can withstand the deformation of the flexible substrate 10 even when the object 50 to which the state detecting device 1 has been attached is greatly deformed (connection to the flexible substrate 10 is not lost) as shown in FIG. 4. Therefore, the state detecting device 1 can be applied even in an environment in which deformation force is applied and a conventional device has been difficult to be installed. Since the all-solid-state battery 30 has high-temperature resistance and no risk caused by volatilization and leakage of an electrolyte unlike a battery containing an organic electrolytic solution, the state detecting device 1 can be applied even in a high-temperature environment in which a conventional device has been difficult to be installed. Since the state detecting device 1 can be applied suitably even in a severe environment, it can be used in various applications.

(2) Since the all-solid-state battery 30 has high-temperature resistance, it can be mounted (connected) to the flexible substrate 10 together with the piezoelectric element 20 and the integrated circuit 40 by reflow soldering, whereby the state detecting device 1 is excellent in low-cost mass production.

Second Embodiment

Figure 6:
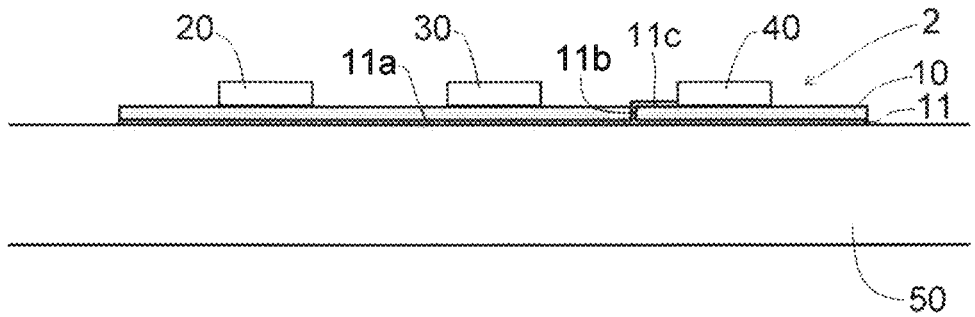
FIG. 6 is an enlarged sectional view of a state detecting device 2 according to a second embodiment and the object 50 to which the state detecting device 2 has been attached.

FIG. 6 is an enlarged sectional view of a state detecting device 2 according to a second embodiment of the present invention and the object 50 to which the state detecting device 2 has been attached. The state detecting device 2 differs from the state detecting device 1 shown in the first embodiment in that a thermal conduction pattern 11 is formed on the flexible substrate 10 but the same as the state detecting device 1 in other points. The thermal conduction pattern 11 includes a first part 11a which is formed on at least part of the under surface (surface on the object 50 side) of the flexible substrate 10, a second part 11b which extends from the first part 11a and penetrates the flexible substrate 10 and a third part 11c which is formed on the top surface of the flexible substrate 10 and connected to the second part 11b and reaches the vicinity of the integrated circuit 40 (vicinity of the temperature sensor). According to this embodiment, in addition to the effect of the first embodiment, the temperature of the object 50 can be measured more precisely as the heat of the object 50 is transmitted to the first part 11a, the second part 11b and the third part 11c of the thermal conduction pattern 11 in the mentioned order and goes to the vicinity of the temperature sensor included in the integrated circuit 40.

Third Embodiment

Figure 7:
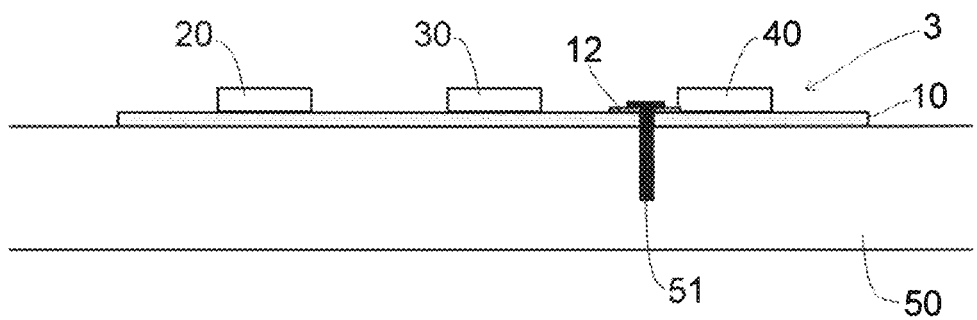
FIG. 7 is an enlarged sectional view of a state detecting device 3 according to a third embodiment and the object 50 to which the state detecting device 3 has been attached.

FIG. 7 is an enlarged sectional view of a state detecting device 3 according to a third embodiment of the present invention and the object 50 to which the state detecting device 3 has been attached. The state detecting device 3 differs from the state detecting device 1 shown in the first embodiment in that a thermal conduction pattern 12 in contact with a thermal conductor 51 incorporated (inserted) into the object 50 is formed on the flexible substrate 10 but the same as the state detecting device 1 in other points. The thermal conductor 51 is a part made of a metal having high thermal conductivity, for example, copper etc. Preferably, the thermal conductor 51 penetrates the flexible substrate 10 in the vicinity of the integrated circuit 40 (vicinity of the temperature sensor) and enters the inside of the object 50.

The thermal conduction pattern 12 is formed on the top surface (surface opposite to the object side) of the flexible substrate 10, is located or extends in the vicinity of the integrated circuit 40 and is sandwiched between the head part of the screw-like thermal conductor 51 and the top surface of the flexible substrate 10. The thermal conductor 51 may be a screw which is screwed to an unshown nut embedded in the object 50 (for example, integrally molded with the object 50), thereby contributing to the attachment of the flexible substrate 10 to the object 50. According to this embodiment, in addition to the effect of the first embodiment, the temperature of the object 50 can be measured more precisely as the heat of the object 50 is transmitted to the thermal conductor 51 and the thermal conduction pattern 12 in the mentioned order and goes to the vicinity of the temperature sensor included in the integrated circuit 40.

Fourth Embodiment

Figure 8:
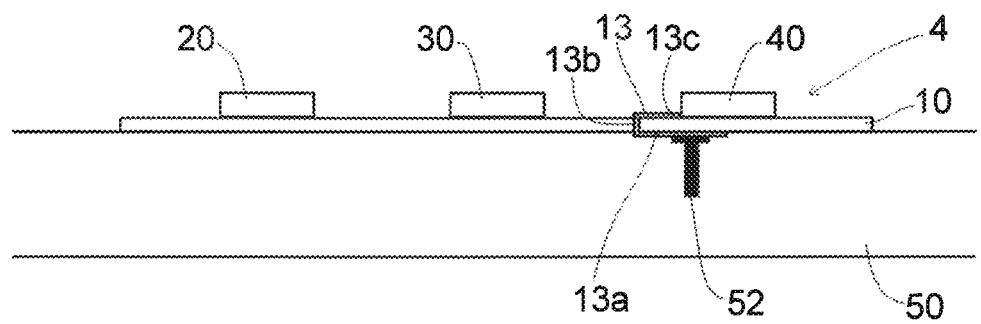
FIG. 8 is an enlarged sectional view of a state detecting device 4 according to a fourth embodiment and the object 50 to which the state detecting device 4 has been attached.

FIG. 8 is an enlarged perspective view of a state detecting device 4 according to a fourth embodiment of the present invention and the object 50 to which the state detecting device 4 has been attached. The state detecting device 4 differs from the state detecting device 1 shown in the first embodiment in that a thermal conduction pattern 13 in contact with a thermal conductor 52 embedded (buried) in the object 50 by integral molding for example is formed on the flexible substrate 10 but the same as the state detecting device 1 in other points. The thermal conductor 52 is a part made of a metal having high heat conductivity, for example, copper etc. Preferably, the thermal conductor 52 is partially exposed to the surface on the flexible substrate 10 side of the object 50 in the vicinity of the integrated circuit 40 (vicinity of the temperature sensor).

The thermal conduction pattern 13 includes a first part 13a which is formed on at least part of the under surface (surface on the object 50 side) of the flexible substrate 10 to be in contact with the thermal conductor 52, a second part 13b which extends from the first part 13a and penetrates the flexible substrate 10, and a third part 13c which is formed on the top surface of the flexible substrate 10 and connected to the second part 13b and reaches the vicinity of the integrated circuit 40 (vicinity of the temperature sensor). According to this embodiment, in addition to the effect of the first embodiment, the temperature of the object 50 can be measured more precisely as the heat of the object 50 is transmitted to the thermal conductor 52 and the first part 13a, second part 13b and third part 13c of the thermal conduction pattern 13 in the mentioned order and goes to the vicinity of the temperature sensor included in the integrated circuit 40.

While the invention has been described in its preferred embodiments, it is to be understood by a person having ordinary skill in the art that variations may be made on each constituent element and process of the embodiments without departing from the scope of the following claims.

EXPLANATIONS OF LETTERS OF NUMERALS 1-4 state detecting device, 10 flexible substrate (FPC),
11-13 thermal conduction pattern, 20 piezoelectric element,
30 all-solid-state battery, 40 integrated circuit,
41 power source IC, 42 communication module,
43 microcontroller (control section), 44 various sensors,
50 object, 60 receiver, 61 communication module,
62 microcontroller (control section)

The invention claimed is:

1. A state detecting device comprising:
    a chargeable all-solid-state battery;
    a power generator which supplies charging power to the chargeable all-solid-state battery;
    a sensor which operates with electrical power supplied from the chargeable all-solid-state battery; and
    a flexible substrate on which the chargeable all-solid-state battery, the power generator, and the sensor are mounted.

2. The state detecting device according to claim 1, wherein the flexible substrate is attached to a flexible object which is to be measured or constitutes at least part of an inner surface of a space to be measured.

3. The state detecting device according to claim 2, wherein the flexible substrate is attached to the object which is to be measured.

4. The state detecting device according to claim 1, including a thermal conduction pattern on at least part of a surface on an object-to-be-measured side of the flexible substrate.

5. The state detecting device according to claim 4, wherein the thermal conduction pattern extends on a surface of the flexible substrate that is opposite to the object-to-be-measured side of the flexible substrate and reaches proximate the sensor mounted on the surface of the flexible substrate that is opposite to the object-to-be-measured side.

6. The state detecting device according to claim 1, including a thermal conduction pattern, which is in contact with a thermal conductor incorporated into an object to be measured, on the flexible substrate, and is located or extends proximate the sensor, on a surface of the flexible substrate on which the sensor is mounted.

7. The state detecting device according to claim 1, wherein the chargeable all-solid-state battery, the power generator, and the sensor are mounted to the flexible substrate by reflow soldering.

8. The state detecting device according to claim 1, wherein the sensor includes at least one sensor selected from the group consisting of a temperature sensor, an acceleration sensor, a pressure sensor, and a distortion sensor.

* * * * *